United States Patent
Wang et al.

(10) Patent No.: US 8,084,847 B2
(45) Date of Patent: Dec. 27, 2011

(54) PREFABRICATED LEAD FRAME AND BONDING METHOD USING THE SAME

(75) Inventors: Lei Wang, Suzhou (CN); Jai-sung Lee, Suzhou (CN); Qian Wang, Suzhou (CN); Zhenging Zhao, Suzhou (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 203 days.

(21) Appl. No.: 12/486,998

(22) Filed: Jun. 18, 2009

(65) Prior Publication Data

US 2009/0315160 A1    Dec. 24, 2009

(30) Foreign Application Priority Data

Jun. 18, 2008  (CN) .......................... 2008 1 0110213
May 12, 2009  (KR) .......................... 10-2009-0041364

(51) Int. Cl.
  *H01L 23/495*    (2006.01)
(52) U.S. Cl. ................................ 257/666; 257/E23.031
(58) Field of Classification Search .................. 257/666, 257/670, 672, 676, E23.031, E23.037, 669, 257/673, 779–780, 784
  See application file for complete search history.

(56) References Cited

U.S. PATENT DOCUMENTS 4,835,120 A * 5/1989 Mallik et al. .................... 29/827
5,173,766 A * 12/1992 Long et al. ..................... 257/687

FOREIGN PATENT DOCUMENTS

| JP | 11-121514 | 4/1999 |
|---|---|---|
| JP | 2007-067342 | 3/2007 |
| KR | 2006-107236 | 10/2006 |

* cited by examiner

*Primary Examiner* — Hoa B Trinh
(74) *Attorney, Agent, or Firm* — Stanzione & Kim, LLP

(57) ABSTRACT

A prefabricated lead frame to bond a chip and a substrate, and a bonding method using the prefabricated lead frame. The prefabricated lead frame includes an inner ring, an outer ring, and a plurality of wires, wherein inner ends and outer ends of the wires are respectively connected to the inner ring and the outer ring, and the prefabricated lead frame has a wire shape corresponding to a chip and a substrate to be bonded. The prefabricated lead frame may be manufactured in batch production to increase the manufacturing efficiency of semiconductor devices, and the prefabricated lead frame may be used instead of a general wire bonding process.

18 Claims, 6 Drawing Sheets

PREFABRICATED LEAD FRAME AND BONDING METHOD USING THE SAME

CROSS-REFERENCE TO RELATED APPLICATIONS

This application claims priority under 35 U.S.C. §119 from Chinese Patent Application No. 200810110213.4, filed on Jun. 18, 2008 and Korean Patent Application No. 10-2009-0041364, filed on May 12, 2009, in the Chinese and Korean Intellectual Property Offices, respectively, the disclosures of which are incorporated herein in their entirety by reference.

BACKGROUND

1. Field of the Invention

The inventive concept relates to a lead frame and a bonding method, and more particularly, to a prefabricated lead frame and a bonding method using the prefabricated lead frame.

2. Description of the Related Art

Wire bonding is a general interconnection method for semiconductor devices. Wire bonding includes connecting pads of a semiconductor chip to I/O (input/output) wires of an electronic package case or to wiring pads on a substrate using metal wires. In a semiconductor packaging process, a wire bonding process is generally used for bonding a first level package, that is, a chip pad and a substrate pad, using metal wires.

FIG. 1 is a schematic view illustrating a structure of a package after a conventional wire bonding process is performed.

In detail, in the package of FIG. 1, a semiconductor chip 2 is electrically connected to a substrate 3 via gold wires 1 through a chip pad 2a. The semiconductor chip 2 is attached to the substrate 3 with an adhesive layer 5 interposed therebetween. The semiconductor chip 2 is connected to a substrate pad 6 via the gold wires 1, and the substrate pad 6 is connected to ball lands 7 and solder balls 9 through a conductive line 6a. Reference numeral 11 denotes an insulating layer. The semiconductor chip 2, the gold wires 1, and a surface of the substrate 3 are protected by an encapsulation material 13.

FIG. 2 is a view illustrating a process flow of a conventional wire bonding process.

In detail, FIG. 2 is a view for explaining a wire bonding process performed using a conventional wire bonding apparatus. The wire bonding apparatus includes a capillary tool 21 through which a gold wire 23 passes and a clamp 25 that grips the gold wire 23. In operation (1), a bonding process, that is, bonding onto a chip pad 27, is prepared. In operation (2), a ball formed on a front end of the gold wire 23 is bonded to the chip pad 27.

In operation (3), the gold wire 23 having a wire shape is formed. In operation (4), reference numeral 29 denotes bonding of the gold wire 23 and a substrate pad (not shown). In operation (5), a tail of the gold wire 23 is cut. In operation (6), a ball 31 is formed at the front end of the gold wire 23 for a next bonding operation.

As described with reference to FIG. 2, the conventional wire bonding process includes bonding the gold wire 23 to each of a plurality of chip pads 27 or a plurality of substrate pads, and the conventional wire bonding process has low manufacturing yields. Also, the conventional wire bonding process is the most time-consuming process from among packaging processes, and thus largely increases the manufacturing costs of a package. In addition, use of gold in the conventional general wire bonding process also increases the manufacturing costs of semiconductor devices.

SUMMARY

The inventive concept provides a prefabricated lead frame which can be used to replace a conventional wire bonding process.

The inventive concept also provides a bonding method using the above-described prefabricated lead frame.

Additional aspects and utilities of the present general inventive concept will be set forth in part in the description which follows and, in part, will be obvious from the description, or may be learned by practice of the general inventive concept.

According to an embodiment and utility of the inventive concept, there is provided a prefabricated lead frame to bond a chip and a substrate. The prefabricated lead frame include an inner ring, an outer ring, and a plurality of wires, wherein inner ends and outer ends of the wires are respectively connected to the inner ring and the outer ring. The prefabricated lead frame has a wire shape corresponding to the chip and the substrate to be bonded.

The prefabricated lead frame may be formed of copper. The inner ring and the outer ring may include a square form. The prefabricated lead frame may be the wire shape formed by punching or etching.

According to another embodiment and utility of the inventive concept, there is provided a method of bonding a chip and a substrate using a prefabricated lead frame. The prefabricated lead frame may include an inner ring, an outer ring, and a plurality of wires, wherein inner ends and outer ends of the wires are respectively connected to the inner ring and the outer ring, and the prefabricated lead frame has a wire shape corresponding to a chip and a substrate to be bonded.

The method may include forming bumps on a heat-resistant substrate, wherein the bumps are arranged to correspond to positions of the inner ends and the outer ends of the plurality of the wires of the prefabricated lead frame. The inner ends and the outer ends of the plurality of the wires may be aligned with the bumps. The bumps may be transferred and connected to the inner ends and the outer ends of the plurality of the wires. The bumps connected to the prefabricated lead frame may be aligned with pads on the chip and the substrate to be bonded. The chip and the substrate may be bonded to each other. The inner ring and the outer ring of the prefabricated lead frame may be cut.

The bumps may be formed of gold. The bumps on the heat-resistant substrate may be connected to the inner ends and the outer ends of the plurality of the wires by thermo-compression bonding. When bonding the chip and the substrate to each other, the bumps on the prefabricated lead frame and the pads on the chip and the substrate may be bonded by thermosonic bonding or by ultrasonic thermo-compression bonding. The prefabricated lead frame may be formed of copper. The heat-resistant substrate may be a glass substrate.

According to an aspect embodiment and utility of the inventive concept, there is also provided a method of forming a prefabricated lead frame to bond a chip and a substrate, the method including forming an inner ring, forming an outer ring, and forming a plurality of wires such that inner ends and outer ends of the wires are respectively connected to the inner ring and the outer ring, wherein the prefabricated lead frame has a wire shape corresponding to a chip and a substrate to be bonded.

According to an aspect embodiment and utility of the inventive concept, there is also provided a semiconductor device including a substrate, a semiconductor chip disposed on the substrate, and a prefabricated lead frame having an inner ring, an outer ring, and a plurality of wires, wherein inner ends and outer ends of the wires are respectively connected to the inner ring and the outer ring, and the prefabricated lead frame has a wire shape corresponding to the chip and the substrate to be bonded.

According to an aspect embodiment and utility of the inventive concept, there is also provided a prefabricated lead frame usable with a semiconductor chip device and a substrate, including an inner ring, an outer ring disposed to be spaced apart from the inner ring, and a plurality of wires connected between the inner ring and the outer ring and formed with the inner ring and the outer ring as a single integrated body.

The wires may include a conductive material, and the inner ring and the outer ring comprise a non-conductive material.

The wires may include first ends to be electrically connected to corresponding conductive pads of the semiconductor chip device, and second ends to be electrically connected to corresponding conductive pads of the substrate.

The wires may be spaced apart from each other to prevent an electrical signal communication.

The inner ring and the outer ring may include an insulating element to electrically insulate ends of the wires.

According to an aspect embodiment and utility of the inventive concept, there is also provided a semiconductor device including a substrate, a semiconductor chip device disposed on the substrate, and a prefabricated lead frame having an inner ring, an outer ring disposed to be spaced apart from the inner ring, and a plurality of wires connected between the inner ring and the outer ring and formed with the inner ring and the outer ring as a single integrated body The prefabricated lead frame may form a space with at least one of the substrate and the semiconductor chip device, and the space may be filled with an insulation material.

The substrate and the semiconductor chip device may be electrically connected through the wires when the prefabricated lead frame is combined with a combination of the substrate and the semiconductor chip device.

The prefabricated lead frame according to the inventive concept may be manufactured in batch production and replace a conventional wire bonding process. Also, according to the inventive concept, there is provided a prefabricated lead frame that may be manufactured at low costs with a high degree of package integration, and a bonding method using the prefabricated lead frame, whereby semiconductor devices may be fabricated with increased manufacturing efficiency and reduced manufacturing costs.

BRIEF DESCRIPTION OF THE DRAWINGS

Exemplary embodiments of the present general inventive concept will be more clearly understood from the following detailed description taken in conjunction with the accompanying drawings in which.

DETAILED DESCRIPTION OF THE EMBODIMENTS

Figure 1:
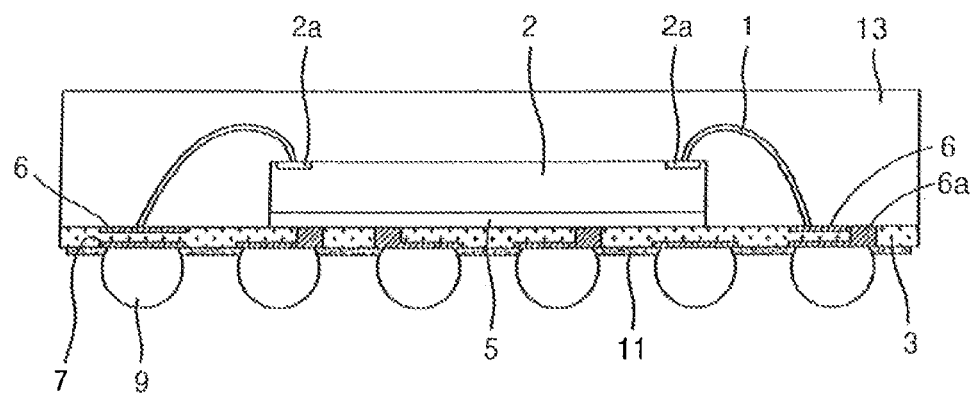
FIG. 1 is a schematic view illustrating a structure of a package after a conventional wire bonding process.
Figure 2:
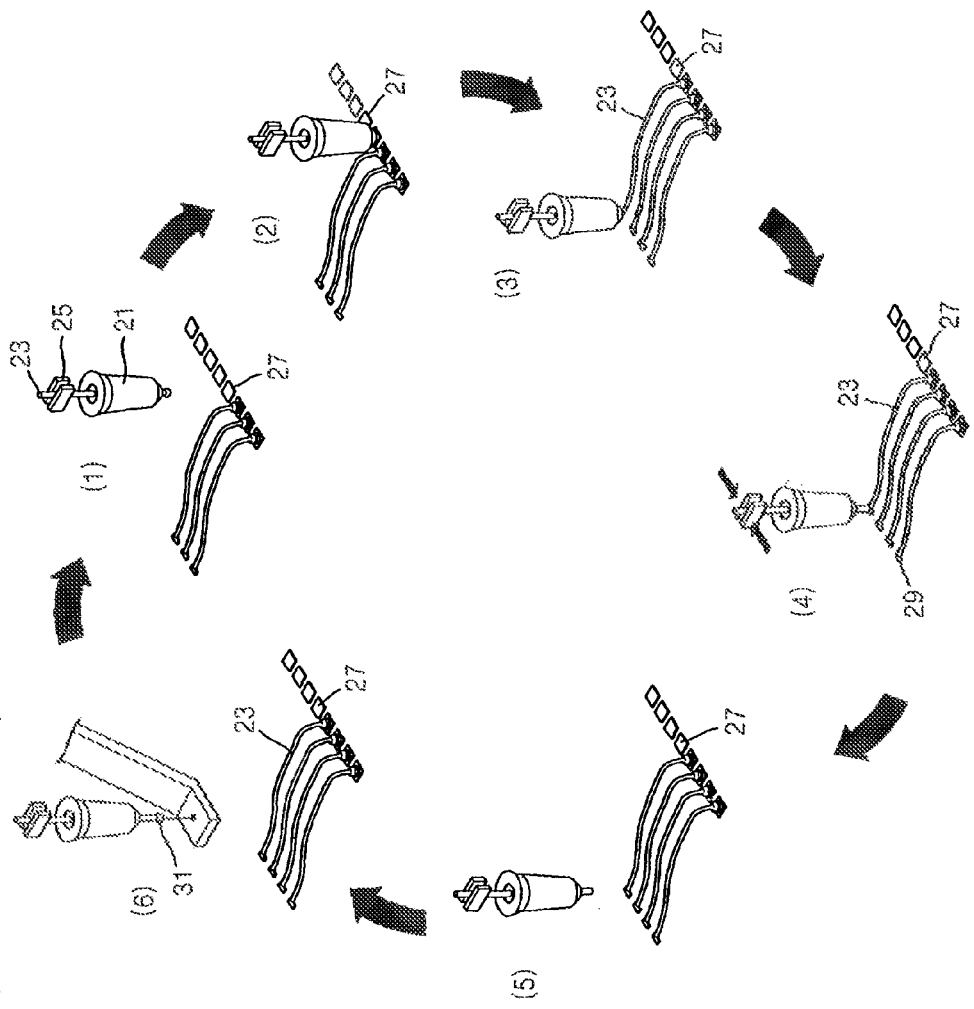
FIG. 2 is a view illustrating a process flow of a conventional wire bonding process.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

The inventive concept includes a prefabricated lead frame for replacing wire bonding between a chip (semiconductor chip) and a substrate (wire substrate). In the present description, a lead frame refers to a connection member between a chip (semiconductor chip) and a substrate (wire substrate), and does not refer to an ordinary lead frame. The prefabricated lead frame may be manufactured in batch production, and only one prefabricated lead frame will be described for convenience.

The term 'prefabricated lead frame' denotes a lead frame that is already completely manufactured when the lead frame is to be connected to a semiconductor chip. Thus, the prefabricated lead frame may also be referred to as a 'lead frame'. In the present description, a first level package comprising a semiconductor chip and a substrate bonded to each other by using the prefabricated lead frame will be mainly described. Obviously, a multi-layer package may also be realized using the first level package.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein; rather, these embodiments are provided so that this disclosure will be thorough and complete, and will fully convey the concept of the inventive concept to those skilled in the art.

Figure 3:
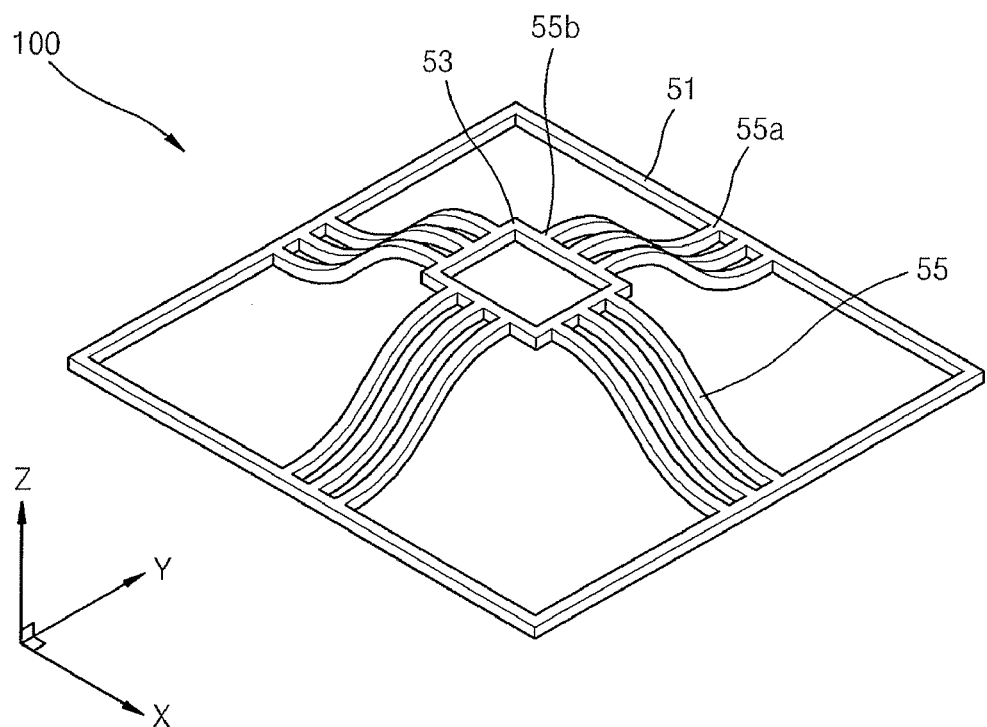
FIG. 3 is a three-dimensional diagram illustrating a structure of a prefabricated lead frame according to an embodiment of the inventive concept.

FIG. 3 is a three-dimensional diagram illustrating a structure of a prefabricated lead frame 100 according to an embodiment of the inventive concept.

Referring to FIG. 3, the prefabricated lead frame 100 includes an outer ring 51, an inner ring 53, and a plurality of wires 55 connecting the outer ring 51 and the inner ring 53. The outer ring 51 and the inner ring 53 support the wires 55 and are used to easily fix or remove the prefabricated lead frame 100 on or from at least one of a semiconductor chip and a substrate. Inner ends 55b and outer ends 55a of the wires 55 are connected to the inner ring 53 and the outer ring 51, respectively.

The outer ring 51, the inner ring 53, and the plurality of the wires 55 of the prefabricated lead frame 100 are formed of copper, but may also be formed of other conductive materials. The inner ring 53 and the outer ring 51 of the present embodiment may also be referred to as an inner frame and an outer frame.

The prefabricated lead frame 100 has a shape corresponding to the arrangement of a semiconductor chip (not illustrated) and a substrate to be bonded. The prefabricated lead frame 100 includes the inner ring 53, the outer ring 51, and the wires 55 in a shape corresponding to a chip and a substrate to be bonded. According to an embodiment of the inventive concept, the wire shape of the prefabricated lead frame 100 conforms to the shape of the chip and the substrate to be bonded and the arrangement of the chip and the substrate.

The plurality of the wires 55 are bent in a predetermined shape so as to fit the arrangement of the semiconductor chip and the substrate, and more will be described thereof in detail later. In the present embodiment, inner ends 55b of the wires 55 are bonded to chip pads (not illustrated) on a semiconductor chip and the outer ends 55a of the wires 55 are bonded to substrate pads (not illustrated) on a substrate, the semiconductor chip being disposed on the substrate. Accordingly, in a three-dimensional structure of the prefabricated lead frame 100, the inner ring 53 and the outer ring 51 are not disposed in the same plane, and the wires 55 are bent in a predetermined shape corresponding to the arrangement of the semiconductor chip and the substrate.

The inner ring 53 is disposed on a first plane parallel to a plane formed by direction X and Y. The first plane may be spaced apart from a second plane on which the outer ring 51 is disposed, in a direction Z. The wires 55 may be end portions extended from the inner ring 53 and the outer ring 51 and a middle portion formed between the corresponding end portions. The end portions of the wires 55 may be disposed parallel to the first plane and/or the second plane, or may have an angle with the first plane and/or the second plane. The middle portion of the wires 55 may be a curved form to connect the corresponding end portions. It is possible that the middle portion of the wires 55 can be a straight line.

Although FIG. 3 illustrates the prefabricated lead frame 100 having four sides to correspond to four groups of wires 55, the present general inventive concept is not limited thereto. It is possible that the prefabricated lead frame 100 may have a number of sides to corresponding to a number of groups of wires. Each group of wires may have different shape or dimensions from other group of wires.

Although FIG. 3 illustrates a single piece of the prefabricated lead frame 100, it is possible that the prefabricated lead frame 100 can be divided into a predetermined number of units (pieces) each including a portion of the inner ring 53, a portion of the outer ring 51, and a group of wires 55. The units can be combined into the single piece to form the prefabricated lead frame 100. The units can be separately or simultaneously connected to corresponding portions of the substrate of FIG. 4.

According to an embodiment of the present general inventive concept, a prefabricated lead frame may include a first frame to correspond to a semiconductor chip, a second frame to correspond to a substrate, and at least two wire units connected between the first frame and the second frame to electrically connect the semiconductor to the substrate. The inner ring 53 may be used as the first frame, and the outer ring 51 may be used as the second frame. The wire units each include a conductive material to electrically connect corresponding conductive pads of the semiconductor chip and the substrate. The first frame, the second frame, and the at least two wire units may be formed in a single monolithic body as the prefabricated lead frame 100.

According to an embodiment of the present general inventive concept, the inner ring 53 and the outer ring 51 may have contact portions disposed to correspond to the ends of the wires 55 and non-contact portions disposed between the contact portions and disposed between adjacent ends of the wires 55. The non contact portions of the inner ring 53 and the outer ring 51 may have a first conductivity and the contact portions may have a second conductivity. The first conductivity may be lower than the second conductivity such that an electrical signal transmission is prevented between the non contact portions and the contact portions. The wires 55 may have conductivity different from the first conductivity.

It is possible that the ends of the wires 55 are disposed on the inner ring 55 and the outer ring 51 to be spaced apart from each other to prevent the electrical signal communication and transmission between the wires. In this case, the first conductivity and the second conductivity may be a same or lower that the conductivity of the wires 55.

The inner ring 53 and the outer ring 51 are in the shape of the chip and the substrate. In the present embodiment, the substrate chip and the substrate have a square shape, and the outer ring 51 and the inner ring 53 may also have a square shape, but the inventive concept is not limited thereto. The inner ring 53 may have a different shape from the outer ring 51. For example, the inner and/or outer rings 53 and 51 may have a circular shape. It is possible that the inner ring 53 and the outer ring 51 may have a shape to correspond to a shape of the second member 59b and the first member 59a, respectively. It is also possible that the inner ring 53 and the outer ring 51 may have a shape to correspond to arrangement of the bumps 57b and 57a, respectively. The inner ring 53 may have an inner thickness and the outer ring may have an outer thickness. The inner thickness may be different from the outer thickness. Also, the wires 55 in the present embodiment are formed of copper, but the inventive concept is not limited thereto. When the wires 55 is formed of copper, the wires 55 may have greater mechanical strength than wires formed of gold, and thus the wires 55 are not deformed in a subsequent molding process. In the present embodiment, the prefabricated lead frame 100 may be formed by punching or etching.

The prefabricated lead frame 100 may be a single monolithic body integrally formed with include the elements describe in FIG. 3. The wires 55 may be electrically separated from each other. That is, the inner ends 53 of the wires 55 may be disposed on the inner ring 53 to be separated from each other, and the outer ends 55a of the wires may be disposed on the outer ring 51 to be separated from each other. The inner ends 53 and the outer ends 55a may be disposed along longitudinal lines of the inner ring 53 and the outer ring 51, respectively, as illustrated in FIG. 3.

It is possible that the inner frame 53 and the outer frame 51 can include portions disposed between inner ends 55b and portions disposed between outer ends 55a to electrically insulate the respective wires 55 and/or ends 55a and 55b.

Figure 8:
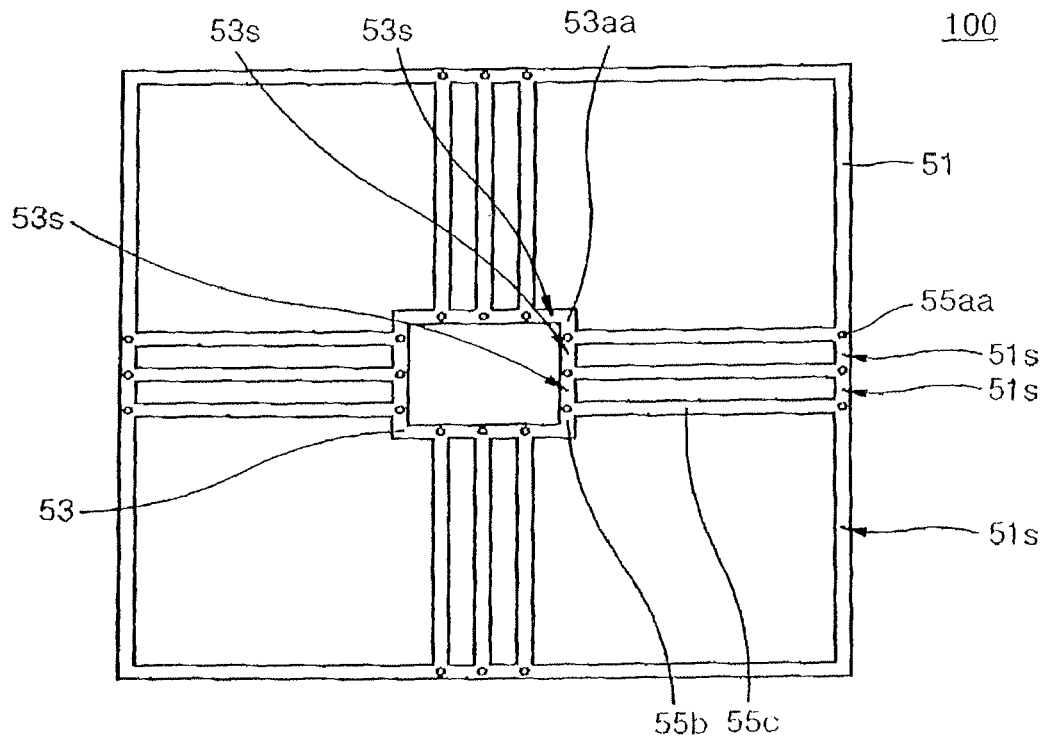
FIGS. 8 and 9 are view illustrating a prefabricated lead frame according to embodiments of the present general inventive concept.

As illustrated in FIG. 8, the wires 55 of the prefabricated lead frame 100 may have extensions 55c electrically separated from each other, inner contacts 53aa formed on the inner frame 53, and outer contacts 55aa formed on the outer frame 51. The inner contacts 53aa and the outer contacts 55aa may be extended from or electrically connected to the respective extensions 55c and may be disposed opposite to each other with respect to the extensions 55c to correspond to the bumps 57a and 57a, respectively. The inner contacts 53aa are disposed to contact the corresponding bumps 57b, and the outer contacts 55aa may be disposed to contact the corresponding bumps 57a. It is possible that the prefabricated lead frame 100 may include insulations 53s formed or disposed between the inner contacts 53aa to prevent an electrical interference, and insulations 51s formed or disposed between the outer contacts 55aa to provide insulation or to prevent an electrical communication between contacts 53aa and 55aa and/or the wires 55.

Figure 4:
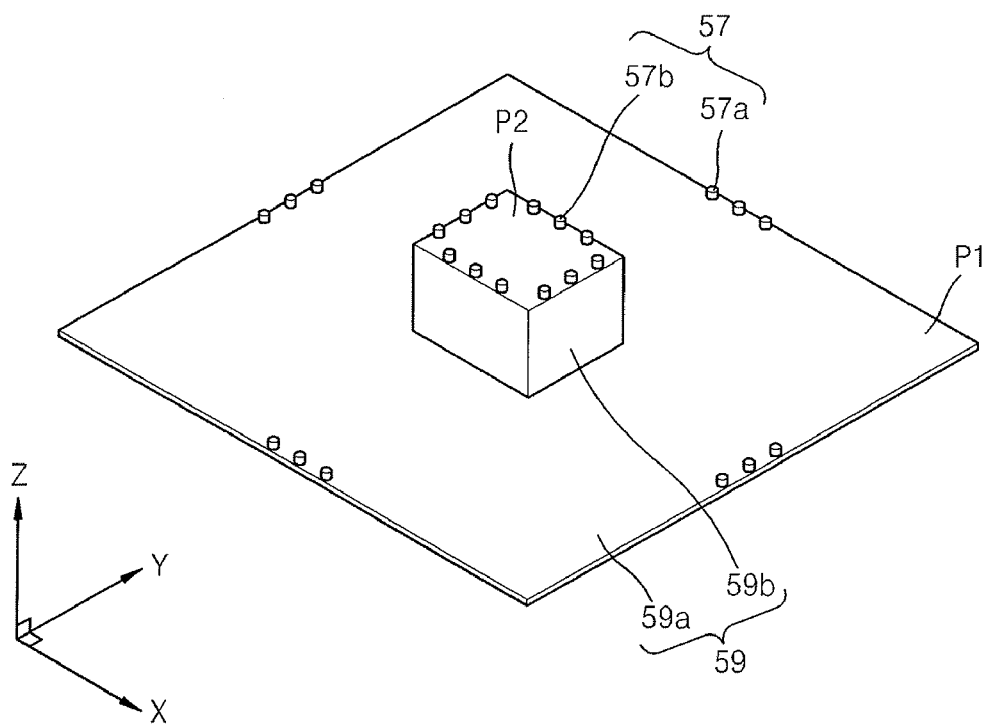
FIGS. 4 and 7 are schematic views illustrating a method of bonding a chip and a substrate using a prefabricated lead frame according to an embodiment of the inventive concept.

The inner contacts 55aa and the outer contacts 53aa may have a shape, for example, a groove or hole, to receive the bumps 57a and 57b, respectively, such that the semiconductor chip can be electrically connected to the substrate through the prefabricated lead frame 100, when the prefabricated lead frame 100 is combined with the substrate of FIG. 4.

Figure 9:
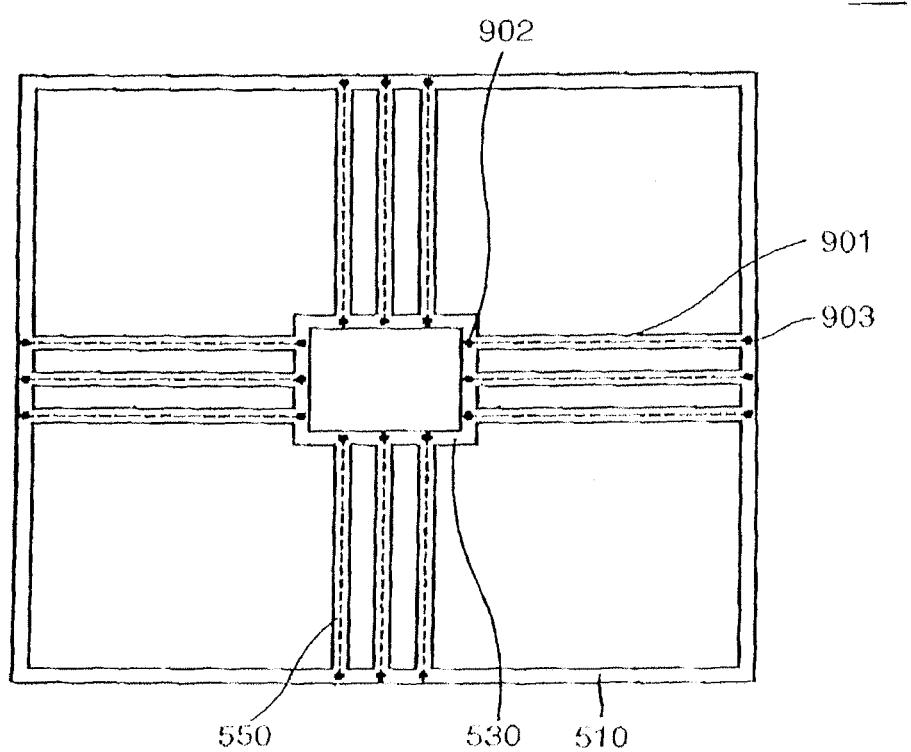

As illustrated in FIG. 9, the prefabricated lead frame 100 may include a first unit having an inner frame 530, an outer frame 510, and a plurality of wires 550 connected between the inner frame 530 and the outer frame 510. The prefabricated lead frame 100 may further include a second unit having a conductive element formed with end conductive elements 902 and 903 disposed on the inner frame 530 and the outer frame 530, respectively, and a middle conductive element 901 connected between the end conductive elements 902 and 903. The first unit may be formed of a non-conductive material and the second unit may be formed of a conductive material. It is possible that the first unit and the second unit may be formed of a conductive material, and an insulation layer may be formed between the end conductive elements 902 to prevent an electrical communication between the adjacent end conductive elements 902 and 903. The second unit is integrally formed with the first unit to form the prefabricated lead frame 100. The end elements 902 and 903 are disposed to electrically contact the corresponding bumps 57a and 57b when the prefabricated lead frame 100 of FIG. 3 is combined with a substrate unit of FIG. 4. It is possible that the first unit and the second unit can be independently formed to be combined as a single integrated body. However, it is possible that the first unit and the second unit can be simultaneously formed as a single integrated body.

Figure 7:
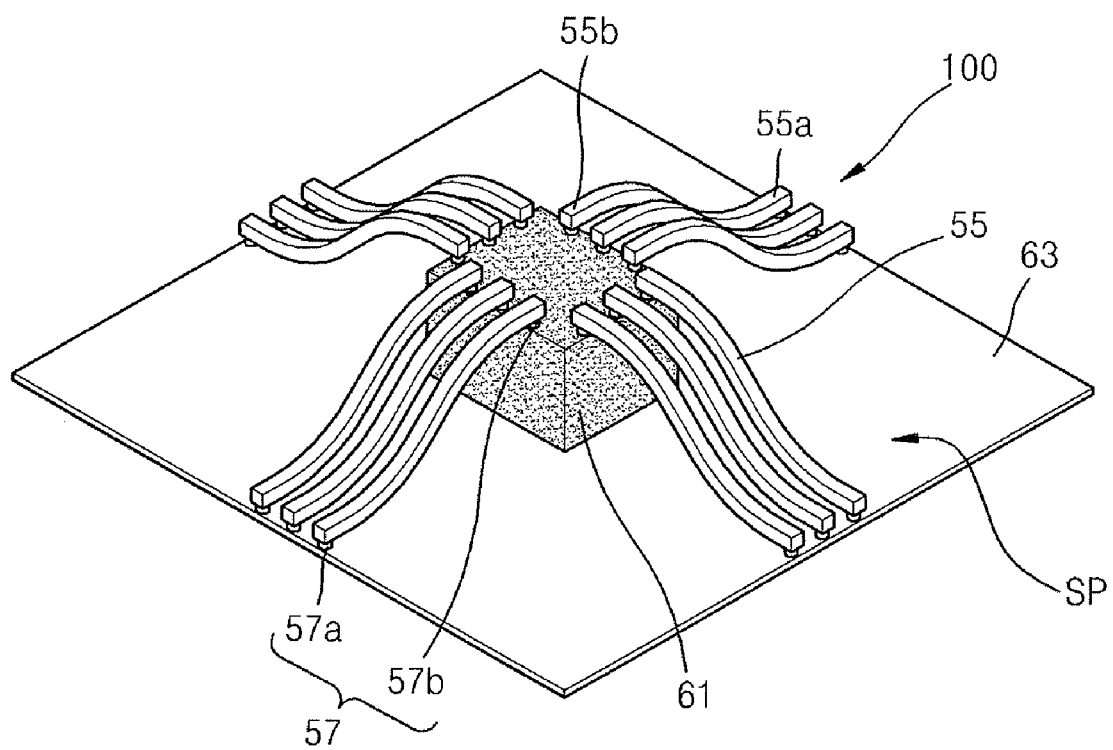

FIGS. 4 and 7 are schematic views illustrating a method of bonding a semiconductor chip and a substrate using a prefabricated lead frame 100 according to an embodiment of the inventive concept.

FIG. 4 is a schematic view illustrating a heat-resistant substrate 59 on which a plurality of bumps 57 are formed.

Referring to FIG. 4, the bumps 57 are formed on the heat-resistant substrate 59, e.g., a glass substrate. The bumps 57 can be easily disconnected or stripped from the heat-resistant substrate 59. The heat-resistant substrate 59 is a three-dimensional structure formed of a first member 59a in a first plane P1 and a second member 59b formed in a second plane P2 disposed at a higher position than the first plane P1.

The positions of the bumps 57 correspond to positions of the inner ends 55b of FIG. 3 and the outer ends 55a of the prefabricated lead frame 100 of FIG. 3. The bumps 57 include first bumps 57a formed in the first plane P1 of the heat-resistant substrate 59 and second bumps 57b formed in the second plane P2 of the heat-resistant substrate 59.

The first bumps 57a are formed to correspond to the outer ends 55a (see FIG. 3) of the prefabricated lead frame 100 (see FIG. 3), and the second bumps 57b are formed to correspond to the inner ends 55b (see FIG. 3) of the prefabricated lead frame 100. The bumps 57 are formed by lithography and electro-plating. According to embodiments of the inventive concept, the bumps 57 may be formed of gold (Au), but the inventive concept is not limited thereto and the bumps 57 may also be formed of other conductive layers.

The first member 59a of the heat resistant substrate 59 may be a printed circuit board with conductive pads (substrate pads or bumps 57a), and the second member 59b of the heat resistant substrate 59 may be a semiconductor chip with conductive pads (chip pads or bumps 57b). The conductive pads of the first member 59a and the second member 59b may be electrically connected to corresponding conductive ends of the wires 55.

Figure 5:
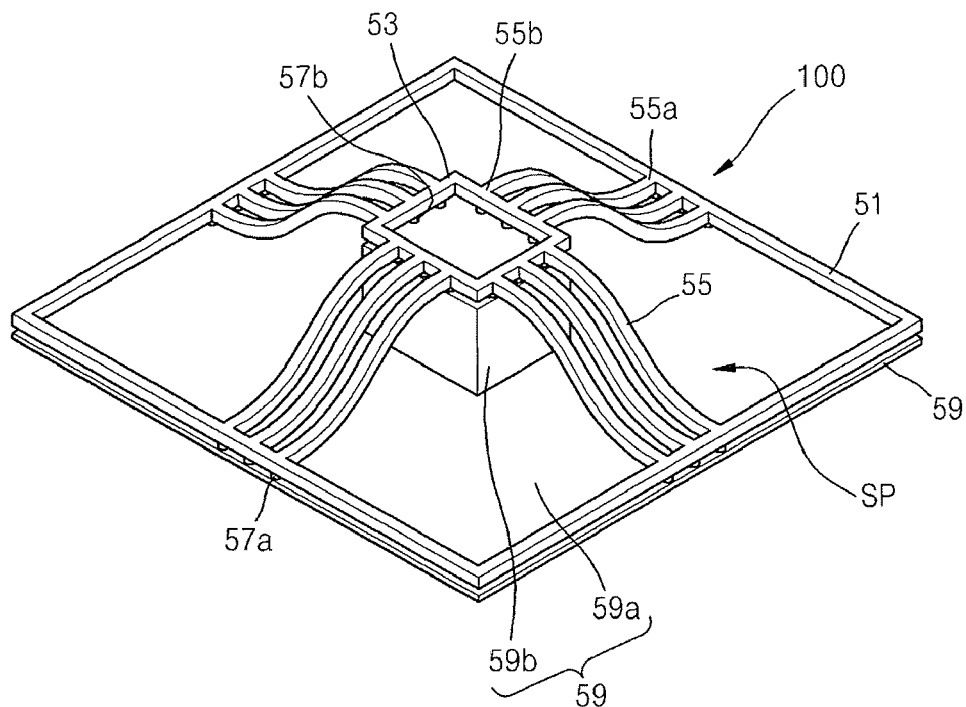
Figure 6:
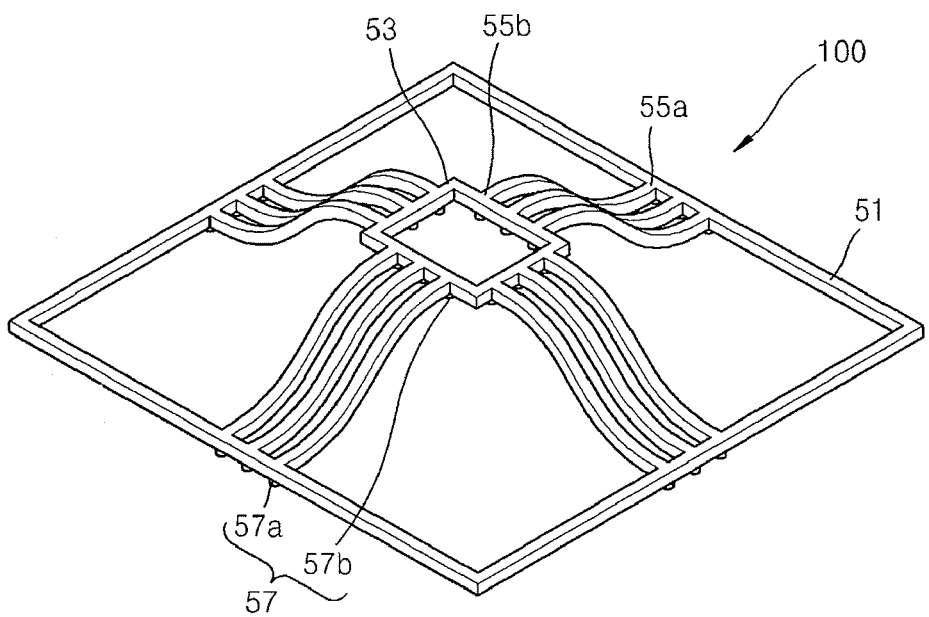

FIG. 5 is a schematic view illustrating the prefabricated lead frame 100 and the heat-resistant substrate 59 bonded to each other, and FIG. 6 is a schematic view illustrating the prefabricated lead frame 100 after the bumps 57 are formed on the heat-resistant substrate 59.

Referring to FIG. 5, the prefabricated lead frame 100 is disposed on the heat-resistant substrate 59 on which the bumps 57 are formed. The inner ends 55b and the outer ends 55a of the wires 55 of the prefabricated lead frame 100 are aligned with the bumps 57 on the heat-resistant substrate 59.

According to the present embodiment, the heat-resistant substrate 59 has the same shape as a substrate chip and a substrate to be bonded. As described above, the heat-resistant substrate 59 has a three-dimensional structure corresponding to the semiconductor chip and the substrate to be bonded. In the present embodiment, the bumps 57a and 57b corresponding to the inner ends 55b and the outer ends 55a of the wires 55 are not disposed in one plane. However, the bumps 57a and 57b may be disposed in one plane according to the shape, position, or height of the predetermined wires 55 of the prefabricated lead frame 100 according to another embodiment of the inventive concept. Accordingly, the bumps 57a and 57b having a modified shape, position, etc., are also included in the inventive concept.

After aligning the inner ends 55b and the outer ends 55a of the wires 55 of the prefabricated lead frame 100 with the bumps 57 of the heat-resistant substrate 59, the bumps 57 are transferred and connected by bonding with the inner ends 55b and the outer ends 55a of the wires 55. The bumps 57 of the heat-resistant substrate 59 are transferred and connected to the wires 55 by thermo-compression bonding via thermal energy and pressure energy.

When the prefabricated lead frame 100 of FIG. 3 and the heat resistant substrate 59 of FIG. 4 are combined, a space SP can be formed as a first space between the prefabricated lead frame 100 and the heat resistant substrate 59, as a second space between wires 55, and/or a third space between the prefabricated lead frame 100 and an external surface surrounding the combination of the prefabricated lead frame 100 and the heat resistant substrate 59. The space SP can be filled with a nonconductive material (or molding material) to determine an external appearance of the combination of the prefabricated lead frame 100 and the heat resistant substrate 59 in a molding process. It is possible that at least one of the first space, second space, and third space can be filled with the material. The material may be a non-conductive material. It is also possible that the combination of the prefabricated lead frame 100 and the heat resistant substrate 59 can be used as a unit without filling the space SP with the material.

According to an embodiment of the present general inventive concept, the combination of the prefabricated lead frame 100 and the heat resistant substrate 59 can be used as an element of an electronic apparatus. At least one of the prefabricated lead frame 100 and the heat resistant substrate 59 may include one or more conductive terminals to be electrically connected to another element of the electronic apparatus to perform its own function or operation of the electronic apparatus. It is possible that a conductive line (signal line) can connect the one or more conductive terminals of the combination to conductive terminals of another element of the electronic apparatus. The electronic apparatus may be a portable computer apparatus, a mobile phone terminal, a telecommunication apparatus, a signal or image processing apparatus, etc.

Accordingly, as illustrated in FIG. 6, the first bumps 57a are disposed on a rear surface of the outer ends 55a of the wires 55 of the prefabricated lead frame 100, and the second bumps 57b are disposed on a rear surface of the inner ends 55b of the wires 55 of the prefabricated lead frame 100.

FIG. 7 is a schematic view illustrating a semiconductor chip 61 bonded to a substrate 63 using a prefabricated lead frame 100 according to an embodiment of the inventive concept.

Referring to FIG. 7, the lead frame 100 including bumps 57 is disposed on a structure including the semiconductor chip 61) and the substrate 63 (wiring substrate) to be bonded. The bumps 57 on the lead frame 100 are disposed so as to be aligned with pads on the semiconductor chip 61 and pads (not shown) on the substrate 63. Accordingly, the semiconductor chip 61 and the substrate 63 are bonded to each other, and thus they are electrically connected to each other.

The bumps 57b formed on the inner ends 55b of the wires 55 are bonded to the chip pads (not illustrated) on the chip 61, and the bumps 57a formed on the outer ends 55a of the wires 55 are bonded to the substrate pads (not illustrated) on the substrate 63. The bumps 57 on the rear surface of the wires 55 and the pads on the chip 61 and the substrate 63 are bonded by thermosonic bonding or ultrasonic thermo-compression bonding. The thermosonic bonding uses heat and sound waves for bonding, and the ultrasonic thermo-compression bonding uses thermal and pressure energy for bonding.

After bonding the bumps 57 on the rear surface of the wires 55 and the pads on the semiconductor chip 61 and the substrate 63, the inner ring 53 and the outer ring 51 of the prefabricated lead frame 100 are cut. Consequently, a bonding structure between the semiconductor chip 61 and the substrate 63 formed by wire bonding is obtained. To protect the substrate 63, the semiconductor chip 61, and the entire surfaces of the wires 55 of the bonding structure, a molding process is performed to deposit an encapsulation material (not shown) thereon. Thus, a semiconductor package is manufactured.

As described above, according to the inventive concept, a prefabricated lead frame formed at low costs with a high degree of package integration is provided. In the inventive concept, a bonding process is performed using the prefabricated lead frame, and thus a semiconductor package can be obtained with increased manufacturing efficiency and reduced manufacturing costs.

While the present general inventive concept has been particularly shown and described with reference to exemplary embodiments thereof, it will be understood that various changes in form and details may be made therein without departing from the spirit and scope of the following claims.

What is claimed is:

1. A prefabricated lead frame to bond a chip and a substrate, the prefabricated lead frame comprising:
   an inner ring;
   an outer ring; and
   a plurality of wires extending between the inner ring and the outer ring, each wire having a first contact area along a bottom surface of the inner ring facing the chip to contact the chip and a second contact area along a bottom surface of the outer ring to contact the substrate.

2. The prefabricated lead frame of claim 1, wherein the prefabricated lead frame is formed of copper.

3. The prefabricated lead frame of claim 1, wherein the inner ring and the outer ring each comprise a square form.

4. The prefabricated lead frame of claim 1, wherein the prefabricated lead frame has the wire shape formed by punching or etching.

5. A semiconductor device comprising:
   a substrate;
   a semiconductor chip disposed on the substrate; and
   a prefabricated lead frame comprising:
      an inner ring;
      an outer ring; and
      a plurality of wires extending between the inner ring and the outer ring, each of the wires including a first contact located on a first surface of the inner ring and a second contact located on a first surface of the outer ring,
   wherein the first surface of the inner ring faces the semiconductor chip and the first surface of the outer ring faces the substrate.

6. A prefabricated lead frame, usable with a semiconductor chip device and a substrate, comprising:
   an inner ring;
   an outer ring disposed to be spaced apart from the inner ring; and
   a plurality of wires connected between the inner ring and the outer ring and formed with the inner ring and the outer ring as a single integrated body, each of the plurality of wires including a first contact located on a first surface of the inner ring to face the semiconductor chip and a second contact located on a first surface of the outer ring to face the substrate.

7. The prefabricated lead frame of claim 6, wherein the wires comprise a conductive material, and portions of the inner ring and the outer ring excluding the first and second contacts of the wires comprise a non-conductive material.

8. The prefabricated lead frame of claim 6, wherein the wires comprise first ends to be electrically connected to corresponding conductive pads of the semiconductor chip device, and second ends to be electrically connected to corresponding conductive pads of the substrate.

9. The prefabricated lead frame of claim 6, wherein the wires are spaced apart from each other to prevent an electrical signal communication.

10. The prefabricated lead frame of claim 6, wherein the inner ring and the outer ring comprise an insulating element to electrically insulate ends of the wires.

11. A semiconductor device comprising:
    a substrate;
    a semiconductor chip device disposed on the substrate; and
    a prefabricated lead frame comprising:
       an inner ring;
       an outer ring disposed to be spaced apart from the inner ring; and
       a plurality of wires connected between the inner ring and the outer ring and formed with the inner ring and the outer ring as a single integrated body, each of the plurality of wires including a first contact located on a first surface of the inner ring to face the semiconductor chip device and a second contact located on a first surface of the outer ring to face the substrate.

12. The semiconductor device of claim 11, wherein the prefabricated lead frame forms a space with at least one of the substrate and the semiconductor chip device, and the space is filled with an insulation material.

13. The semiconductor device of claim 11, wherein the substrate and the semiconductor chip device are electrically connected through the wires when the prefabricated lead frame is combined with a combination of the substrate and the semiconductor chip device.

14. The prefabricated lead frame of claim 1, wherein the first and second contact areas have a first conductivity, and the inner ring and the outer ring excluding the contact areas have a second conductivity less than the first conductivity.

15. The prefabricated lead frame of claim 1, wherein the first and second contact areas electrically connect each wire to conductive bumps on the chip and the substrate, respectively.

16. The prefabricated lead frame of claim 1, wherein a line circumscribing the inner ring defines a first plane,
    a line circumscribing the outer ring defines a second plane, and
    the first and second planes are not co-planar.

17. The semiconductor device of claim 5, wherein the first contact is mounted to the semiconductor chip and the second contact is mounted to the substrate.

18. The semiconductor device of claim 5, wherein each of the semiconductor chip and the prefabricated lead frame are mounted on a same surface of the substrate.

* * * * *